United States Patent
Utsumi (10) Patent No.: US 9,391,017 B2
(45) Date of Patent: Jul. 12, 2016

(54) SEMICONDUCTOR INTEGRATED CIRCUIT

(71) Applicant: KABUSHIKI KAISHA TOSHIBA, Minato-ku, Tokyo (JP)

(72) Inventor: Tetsuaki Utsumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 376 days.

(21) Appl. No.: 13/950,649

(22) Filed: Jul. 25, 2013

(65) Prior Publication Data

US 2014/0252650 A1 Sep. 11, 2014

(30) Foreign Application Priority Data

Mar. 8, 2013 (JP) .................................. 2013-047194

(51) Int. Cl.
*H01L 23/528* (2006.01)
*H01L 23/522* (2006.01)

(52) U.S. Cl.
CPC ........ *H01L 23/5226* (2013.01); *H01L 23/5283* (2013.01); *H01L 23/5286* (2013.01); *H01L 2924/0002* (2013.01)

(58) Field of Classification Search
CPC .................................................. H01L 23/5226
See application file for complete search history.

(56) References Cited

U.S. PATENT DOCUMENTS

| | | | |
|---|---|---|---|
| 5,742,099 A | 4/1998 | Debnath et al. | |
| 6,609,242 B1 | 8/2003 | Slade | |
| 7,514,795 B2 | 4/2009 | Nishimura | |
| 7,525,198 B2 | 4/2009 | Kishishita | |
| 7,694,260 B2 | 4/2010 | Tamiya | |
| 7,932,610 B2 | 4/2011 | Nishimura | |
| 2006/0071319 A1* | 4/2006 | Nishimura | H01L 21/76838 257/691 |
| 2006/0131612 A1 | 6/2006 | Kishishita | |
| 2006/0157739 A1 | 7/2006 | Tamiya | |
| 2008/0054307 A1 | 3/2008 | Shimizu | |
| 2008/0217755 A1 | 9/2008 | Takase | |
| 2009/0166883 A1 | 7/2009 | Nishimura | |
| 2010/0237508 A1 | 9/2010 | Utsumi | |
| 2013/0063203 A1 | 3/2013 | Utsumi et al. | |

FOREIGN PATENT DOCUMENTS

| | | |
|---|---|---|
| JP | 2008-227500 A | 9/2008 |
| JP | 2009-038240 A | 2/2009 |

OTHER PUBLICATIONS

Japanese Office Action issued on Jun. 16, 2015 in corresponding Japanese Application No. 2013-047194, along with English translation thereof.

* cited by examiner

*Primary Examiner* — William Harriston
(74) *Attorney, Agent, or Firm* — White & Case LLP (57) ABSTRACT

In one embodiment, a semiconductor integrated circuit includes power supply strap wires extending in a first direction in a first layer, auxiliary power supply strap wires extending in the first direction in a second layer below the first layer, and intermediate power supply wires each electrically connecting one of the power supply strap wires to one of the auxiliary power supply strap wires in a third layer between the first and second layers. The circuit further includes power supply rails extending in a second direction in a fourth layer below the second layer, and upper power supply strap wires extending in the second direction in a fifth layer above the first layer. An interval between the intermediate power supply wires is larger than an interval between the power supply rails, and is smaller than an interval between the upper power supply strap wires.

21 Claims, 7 Drawing Sheets

SEMICONDUCTOR INTEGRATED CIRCUIT

CROSS REFERENCE TO RELATED APPLICATION

This application is based upon and claims the benefit of priority from the prior Japanese Patent Application No. 2013-47194, filed on Mar. 8, 2013, the entire contents of which are incorporated herein by reference.

FIELD

Embodiments described herein relate to a semiconductor integrated circuit.

BACKGROUND

When power supply wires are arranged in a semiconductor integrated circuit, wires for VDD and wires for VSS are arranged in each routing layer, and wires in different routing layers are connected to each other by via plugs. In this case, if the power supply wires and the via plugs occupy many routing tracks in each routing layer, signal wire efficiency becomes lower. On the other hand, if the number of the power supply wires and the number of the via plugs are simply reduced in order to prevent the signal wire efficiency from becoming lower, a drop of the power supply voltage becomes larger.

DETAILED DESCRIPTION

Embodiments will now be explained with reference to the accompanying drawings.

In one embodiment, a semiconductor integrated circuit includes one or more power supply strap wires arranged in a first routing layer and extending in a first direction. The circuit further includes one or more auxiliary power supply strap wires arranged in a second routing layer below the first routing layer and extending in the first direction. The circuit further includes intermediate power supply wires arranged in a third routing layer between the first and second routing layers, each of the intermediate power supply wires electrically connecting one of the power supply strap wires to one of the auxiliary power supply strap wires. The circuit further includes power supply rails arranged in a fourth routing layer below the second routing layer, extending in a second direction perpendicular to the first direction, and electrically connected to the auxiliary power supply strap wires. The circuit further includes upper power supply strap wires arranged in a fifth routing layer above the first routing layer, extending in the second direction, and electrically connected to the power supply strap wires. An interval in the first direction between the intermediate power supply wires is larger than an interval in the first direction between the power supply rails, and is smaller than an interval in the first direction between the upper power supply strap wires.

Figure 1:
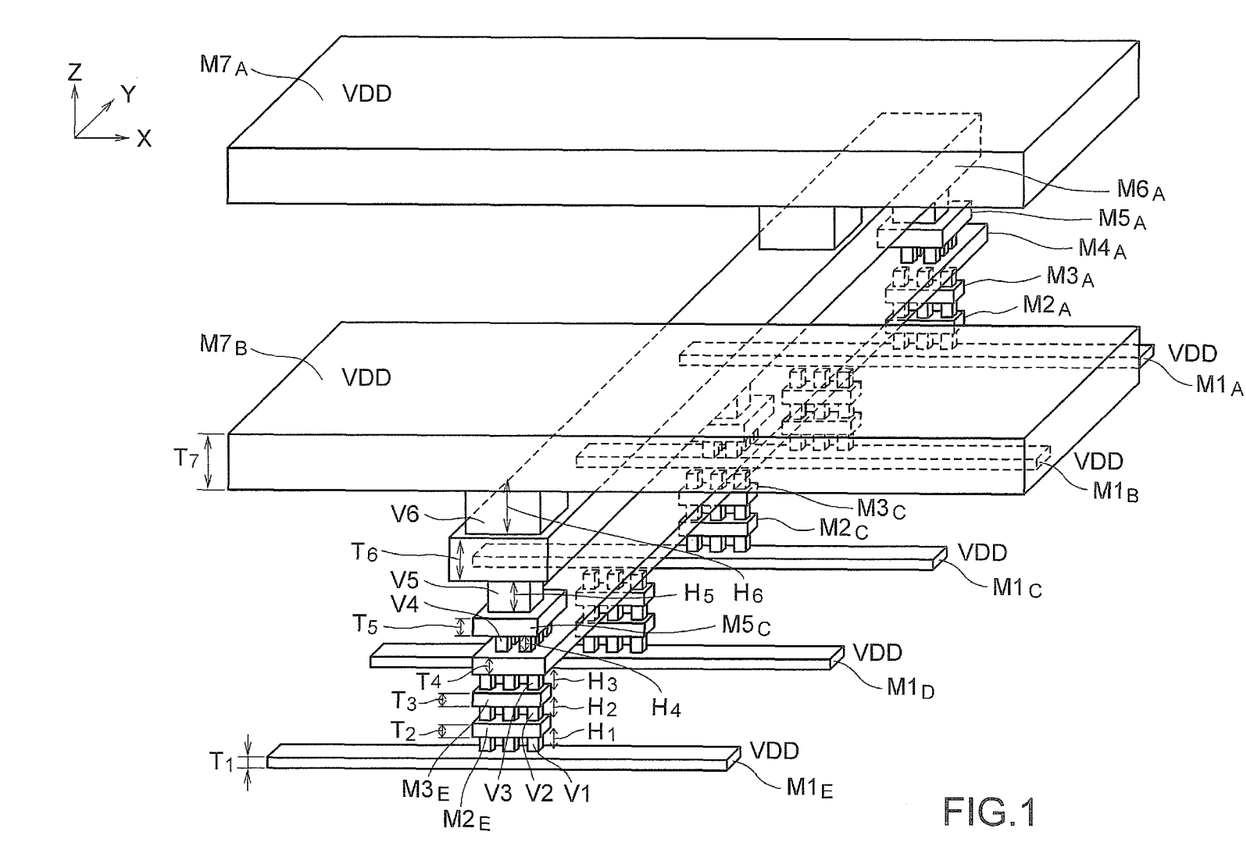
FIG. 1 is a perspective view illustrating a structure of a semiconductor integrated circuit of a first embodiment.

First Embodiment (1) Description of Structure in FIG. 1

FIG. 1 is a perspective view illustrating a structure of a semiconductor integrated circuit of a first embodiment.

FIG. 1 illustrates power supply wires in an M1 routing layer, an M2 routing layer above the M1 routing layer, an M3 routing layer above the M2 routing layer, an M4 routing layer above the M3 routing layer, an M5 routing layer above the M4 routing layer, an M6 routing layer above the M5 routing layer, and an M7 routing layer above the M6 routing layer. The M6, M4, M5, M1 and M7 routing layers are examples of first, second, third, fourth and fifth routing layers, respectively. Further, reference signs $T_1$ to $T_7$ denote the thicknesses of the power supply wires in the M1 to M7 routing layers, respectively.

FIG. 1 also illustrates first-layer via plugs V1 electrically connecting the power supply wires in the M1 and M2 routing layers, second-layer via plugs V2 electrically connecting the power supply wires in the M2 and M3 routing layers, third-layer via plugs V3 electrically connecting the power supply wires in the M3 and M4 routing layers, fourth-layer via plugs V4 electrically connecting the power supply wires in the M4 and M5 routing layers, fifth-layer via plugs V5 electrically connecting the power supply wires in the M5 and M6 routing layers, and sixth-layer via plugs V6 electrically connecting the power supply wires in the M6 and M7 routing layers. The via plugs V5 and V4 are examples of first and second via plugs, respectively. Further, reference signs $H_1$ to $H_6$ denote the thicknesses of the via plugs V1 to V6, respectively.

FIG. 1 also illustrates X and Y directions that are parallel to the M1 to M7 routing layers and are perpendicular to each other, and a Z direction perpendicular to the M1 to M7 routing layers. The Y and X directions are examples of first and second directions, respectively.

All the power supply wires in FIG. 1 are VDD wires. The present embodiment also can be applied to the case where all the power supply wires in FIG. 1 are VSS wires, and the case where all the power supply wires in FIG. 1 are wires that supply potentials other than VDD and VSS.

Figure 2:
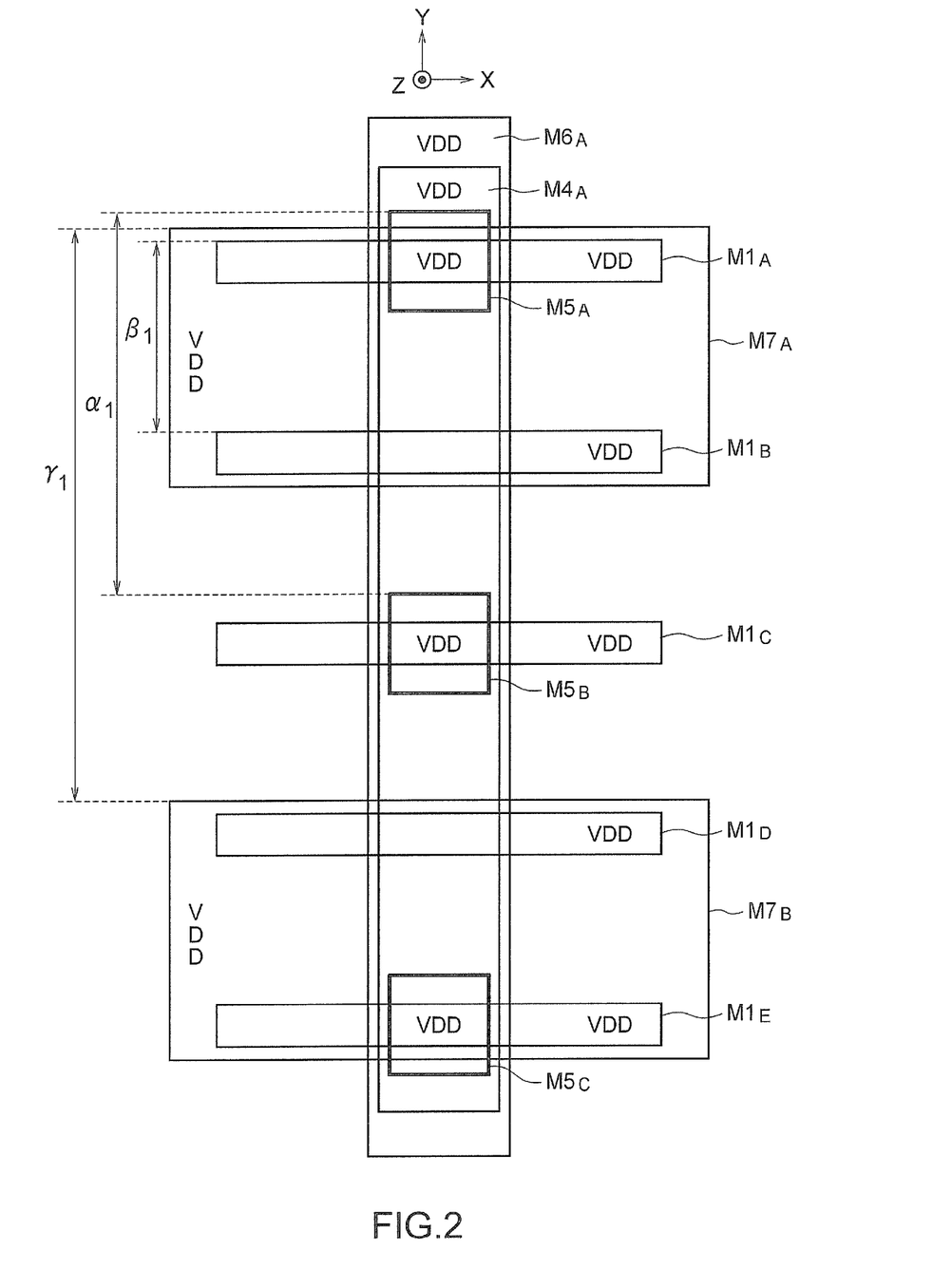
FIG. 2 is a plan view illustrating the structure of the semiconductor integrated circuit of the first embodiment.

(2) Description of Structure in FIG. 2

FIG. 2 is a plan view illustrating the structure of the semiconductor integrated circuit of the first embodiment.

Subscripts in the reference signs M1 to M7 are added to distinguish power supply wires in the same layer. In FIG. 2, the M2 and M3 routing layers and the via plugs V1 to V6 are omitted for ease of illustration.

The M6 routing layer includes a power supply strap wire $M6_A$. The power supply strap wire $M6_A$ extends in the direction. Although the M6 routing layer includes one power supply strap wire in FIG. 2, it may include two or more power supply strap wires.

The M4 routing layer includes an auxiliary power supply strap wire $M4_A$. The auxiliary power supply strap wire $M4_A$ extends in the Y direction. The wire $M6_A$ corresponds to a main power supply strap wire, whereas the wire $M4_A$ corresponds to an auxiliary power supply strap wire that mediates connection between the main power supply strap wire and power supply rails to be described later. Although the M4 routing layer includes one auxiliary power supply strap wire in FIG. 2, it may include two or more auxiliary power supply strap wires.

Figure 4:
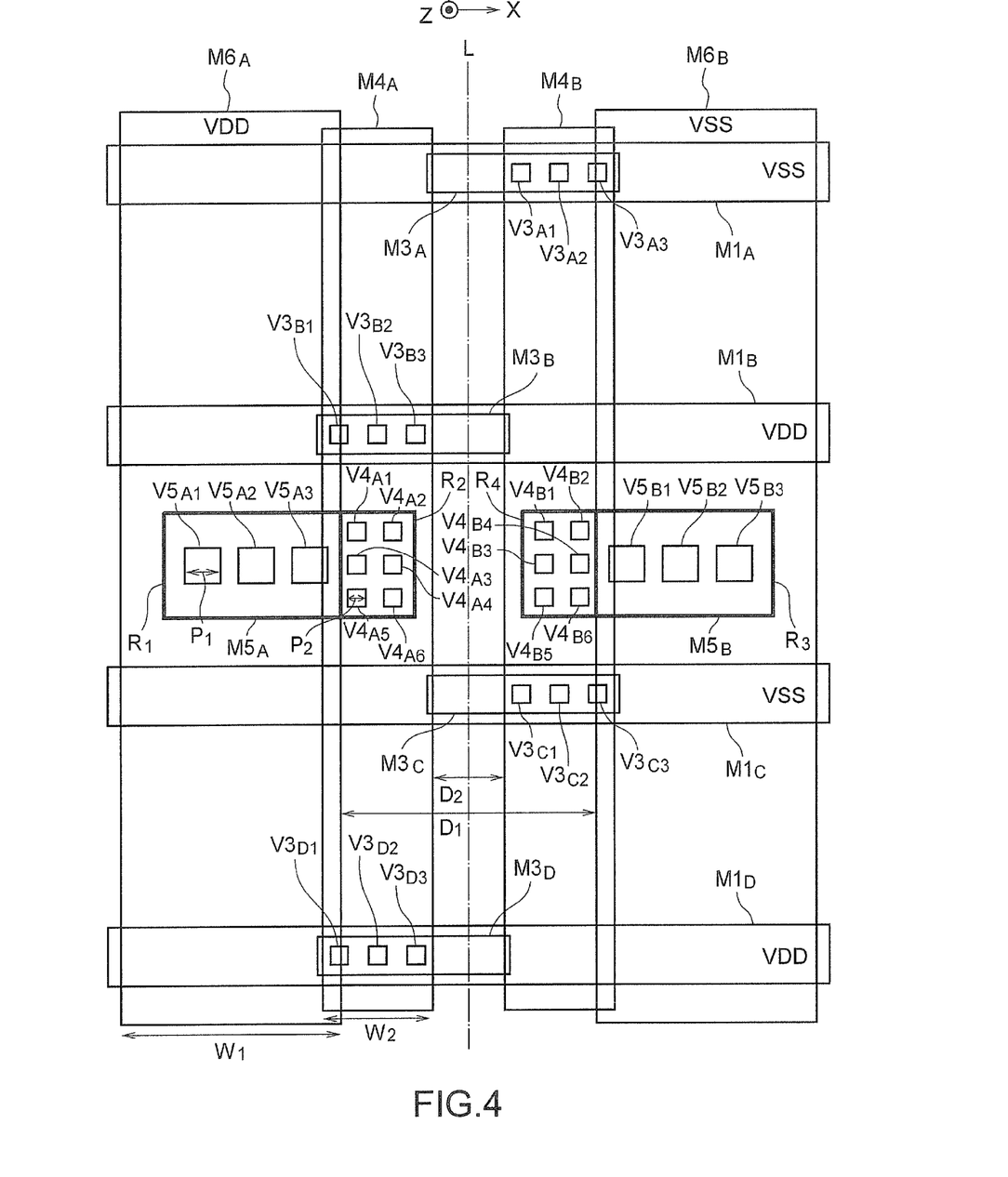
FIG. 4 is a plan view illustrating the structure of the semiconductor integrated circuit of the second embodiment.

The M5 routing layer includes a plurality of intermediate power supply wires that electrically connects one power supply strap wire $M6_A$ to one auxiliary power supply strap wire $M4_A$. FIG. 4 illustrates three intermediate power supply wires $M5_A$ to $M5_C$ as examples of such intermediate power supply wires.

The intermediate power supply wires $M5_A$ to $M5_C$ are arranged periodically along the Y direction. A reference sign $\alpha_1$ denotes the Y-directional interval between the intermediate power supply wires $M5_A$ to $M5_C$.

The M1 routing layer includes a plurality of power supply rails electrically connected to the auxiliary power supply strap wire $M4_A$. FIG. 2 illustrates five power supply rails $M1_A$ to $M1_E$ as examples of such power supply rails. The wires $M1_A$ to $M1_E$ extend in the X direction and are arranged so as to be adjacent to one another. The wires $M1_A$ to $M1_E$ are electrically connected to the auxiliary power supply strap wire $M4_A$ with the intermediation of the power supply wires in the M2 and M3 routing layers (see FIG. 1).

The power supply rails $M1_A$ to $M1_E$ are arranged periodically along the Y direction. A reference sign $\beta_1$ denotes the Y-directional interval between the power supply rails $M1_A$ to $M1_E$. In the present embodiment, the interval $\alpha_1$ between the intermediate power supply wires $M5_A$ to $M5_C$ is set to be larger than the interval $\beta_1$ between the power supply rails $M1_A$ to $M1_E$ ($\alpha_1 > \beta_1$).

A wire structure of the present embodiment can be applied to, for example, the case where power supply is supplied to standard cells each including two types of power supply rail connecting terminals (VDD and VSS connecting terminals) in the M1 routing layer. In this case, VDD power supply rails, VSS power supply rails, and the standard cells are arranged in the following manner, for example, 1) The VDD power supply rails are arranged in the M1 routing layer, and the interval between the VDD power supply rails is set to $\beta_1$. 2) The VSS power supply rails are arranged in the M1 routing layer so as to be alternate with the VDD power supply rails, and the interval between the VSS power supply rails is set to be $\beta_1$. 3) The standard cells are arranged in spaces between the VDD power supply rails and the VSS power supply rails, so that the VDD and VSS power supply rails are respectively connected to the VDD and VSS connecting terminals of the standard cells.

Further, the wire structure of the present embodiment can also be applied to, for example, the case where power is supplied to standard cells each including three or more types of power supply rail connecting terminals in the M1 routing layer. In this case, three or more types of power supply rails are arranged at positions respectively corresponding to the power supply rail connecting terminals.

Further, the interval between the intermediate power supply wires $M5_A$ to $M5_C$ may be configured by repeating N types of values $\alpha_1, \alpha_2, \ldots, \alpha_N$ (N is an integer equal to or more than 2), instead of the single value $\alpha_1$. Similarly, the interval between the power supply rails $M1_A$ to $M1_E$ may be configured by repeating M types of values $\beta_1, \beta_2, \ldots, \beta_M$ (M is an integer equal to or more than 2), instead of the single value $\beta_1$. That is, the pitch between the intermediate power supply wires $M5_A$ to $M5_C$ and the pitch between the power supply rails $M1_A$ to $M1_E$ may be non-constant in the above-mentioned repetition. Such a wire structure is adopted for, for example, the case where standard cell rows having different heights are alternately provided and the case where rows which include no cell and are used for signal wires, are provided periodically between the standard cell rows. In this case, the wire structure of the present embodiment is configured such that $\alpha_i > \beta_j$ is established (i and j are arbitrary integers that satisfy i=1 to N and j=1 to M).

The semiconductor integrated circuit of the present embodiment may include M7 and higher routing layers. In this case, as illustrated in FIG. 2, the semiconductor integrated circuit of the present embodiment may further include a plurality of power supply strap wires (hereinafter referred to as "upper power supply strap wires") that extend in the X direction in the M7 routing layer. This can further enhance a power supply supplying function.

The M7 routing layer includes a plurality of upper power supply strap wires electrically connected to the power supply strap wire $M6_A$. FIG. 2 illustrates two upper power supply strap wires $M7_A$ and $M7_B$ as examples of such upper power supply strap wires. The wires $M7_A$ and $M7_B$ extend in the X direction and are arranged so as to be adjacent to each other.

The upper power supply strap wires $M7_A$ and $M7_B$ are arranged periodically along the Y direction. A reference sign $\gamma_1$ denotes the Y-directional interval between the upper power supply strap wires $M7_A$ and $M7_B$. In the present embodiment, the interval $\alpha_1$ between the intermediate power supply wires $M5_A$ to M5 is set to be smaller than the interval $\gamma_1$ between the upper power supply strap wires $M7_A$ and $M7_B$ ($\alpha_1 < \gamma_1$).

The interval between the intermediate power supply wires $M5_A$ to $M5_C$ may be configured by repeating N types of values $\alpha_1, \alpha_2, \ldots, \alpha_N$ (N is an integer equal to or more than 2), instead of the single value $\alpha_1$. Similarly, the interval between the upper power supply strap wires $M7_A$ and $M7_B$ may be configured by repeating L types of values $\gamma_1, \gamma_2, \ldots, \gamma_L$ (L is an integer equal to or more than 2), instead of the single value $\gamma_1$. That is, the pitch between the intermediate power supply wires $M5_A$ to $M5_C$ and the pitch between the upper power supply strap wires $M7_A$ and $M7_B$ may be non-constant in the above-mentioned repetition. In this case, the wire structure of the present embodiment is configured such that $\alpha_i > \gamma_k$ is established (i and k are arbitrary integers that satisfy i=1 to N and k=1 to L).

(3) Advantages of Semiconductor Integrated Circuit of First Embodiment

Advantages of the semiconductor integrated circuit of the first embodiment will be described in detail with reference to FIG. 1 and FIG. 2.

In the case where power supply wires and via plugs that connect the power supply strap wire $M6_A$ to the power supply rails $M1_A$ to $M1_E$ are arranged at the same number in each routing layer, the routing tracks available for signal wires in the X direction directly below the power supply strap wire $M6_A$ are restricted by the power supply wires and the via plugs that connect the power supply strap wire $M6_A$ to the power supply rails $M1_A$ to $M1_E$, in the M1, M3, and M5 routing layers in which the X direction is a preferred routing direction. For example, in the case where the thickness $T_6$ of the M6 routing layer is larger than the thicknesses $T_1$ to $T_5$ of the M1 to M5 routing layers, it is desirable to set the size of the via plug V5 to be larger than the sizes of the via plugs V1 to V4 for manufacture reasons. In this case, the sizes of the intermediate power supply wires $M5_A$ to $M5_C$ become larger accordingly, and therefore the usable signal routing track number becomes smaller.

In contrast, in the present embodiment, the interval $\alpha_1$ between the intermediate power supply wires $M5_A$ to $M5_C$ is set to be larger than the interval $\beta_1$ between the power supply rails $M1_A$ to $M1_E$ ($\alpha_1 > \beta_1$). As a result, according to the present embodiment, the interval $\alpha_1$ is set to be larger, and the number of the intermediate power supply wires $M5_A$ to $M5$ is made smaller, whereby a large region for signal wire arrangement can be secured in the M5 routing layer.

Meanwhile, in the case where the interval $\alpha_1$ between the intermediate power supply wires $M5_A$ to $M5_C$ is larger than the interval $\gamma_1$ between the upper power supply strap wires $M7_A$ and $M7_B$, effects of the auxiliary power supply strap wire $M4_A$ become larger and a current path detours, in a power supplying route from the upper power supply strap wires $M7_A$ and $M7_B$ to the power supply rail connecting terminals of the standard cells in the M1 routing layer. Therefore, in the power supplying route, a rate of a drop of the power supply voltage in the auxiliary power supply strap wire $M4_A$ becomes larger. This is remarkable in the case where the thickness $T_4$ of the M4 routing layer is smaller than the thickness $T_6$ of the M6 routing layer.

In contrast, in the present embodiment, the interval $\alpha_1$ between the intermediate power supply wires $M5_A$ to $M5_C$ is set to be smaller than the interval $\gamma_1$ between the upper power supply strap wires $M7_A$ and $M7_B$ ($\alpha_1 < \gamma_1$). As a result, according to the present embodiment, the interval $\alpha_1$ is set to be smaller than the interval $\gamma_1$, and the number of the intermediate power supply wires $M5_A$ to $M5_E$ is made larger than the number of the upper power supply strap wires $M7_A$ and $M7_B$, whereby a problem that an insufficient number of the intermediate power supply wires $M5_A$ to $M5_E$ causes an excessive drop of the power supply voltage can be suppressed.

According to the present embodiment, the configuration described above can reduce regions used for power supply wires, and can increase routing tracks usable for signal wires. As a result, according to the present embodiment, signal wire congestion can be alleviated, and signal wire efficiency can be improved. This can be expected to suppress, for example, an increase in costs due to an increase in chip area, an increase in signal wire length for detouring around power supply wires, a decrease in accuracy of timing control, an increase in cell area, and an increase in consumed power.

Although the intermediate power supply wires $M5_A$ to $M5_C$, the power supply rails $M1_A$ to $M1_E$, and the upper power supply strap wires $M7_A$ and $M7_B$ are arranged periodically in the present embodiment, the semiconductor integrated circuit of the present embodiment may include both a periodic region in which these wires are arranged periodically and a non-periodic region in which these wires are arranged non-periodically. In this case, the relation of $\beta_1 < \alpha_1 < \gamma_1$ can be set within the periodic region.

Figure 3:
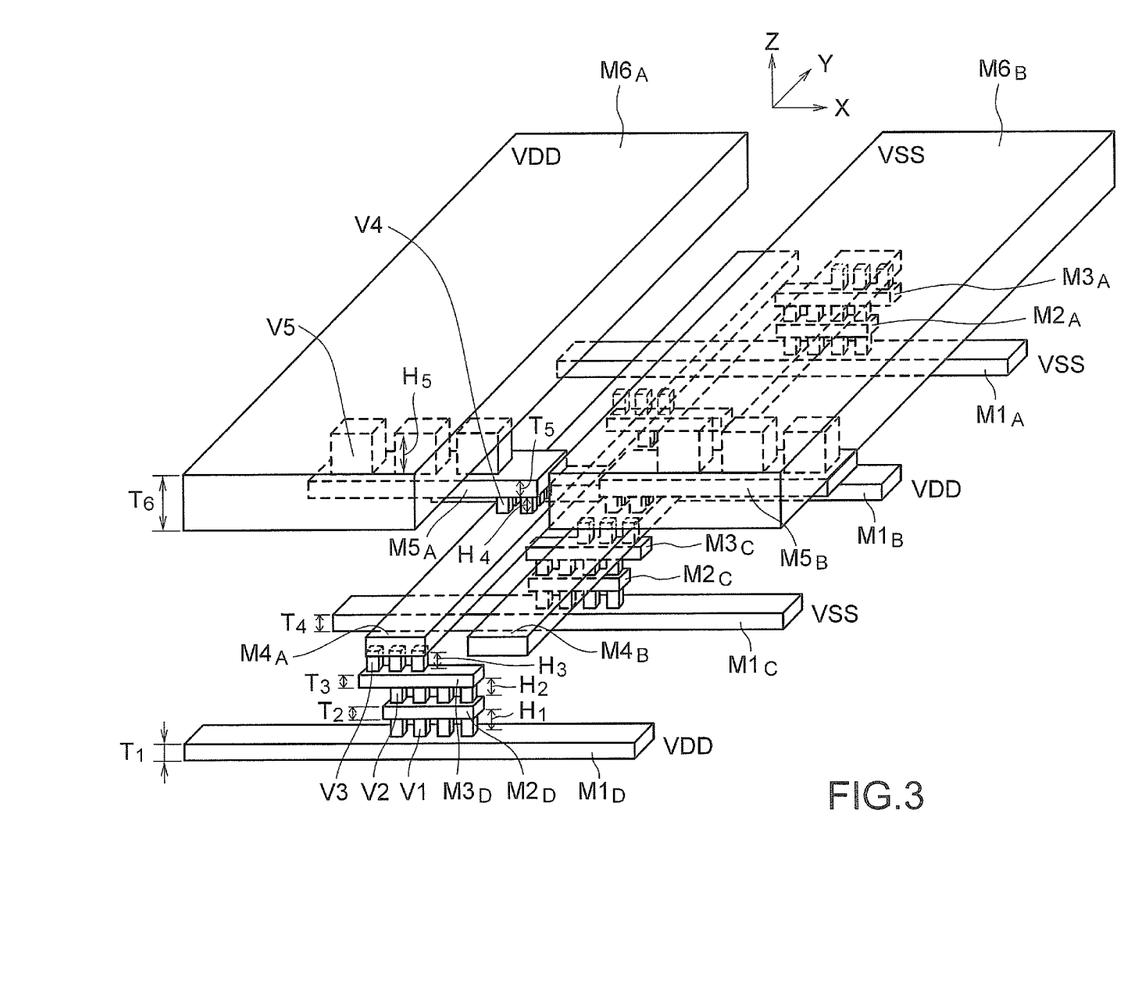
FIG. 3 is a perspective view illustrating a structure of a semiconductor integrated circuit of a second embodiment.

Second Embodiment (1) Description of Structure in FIG. 3

FIG. 3 is a perspective view illustrating a structure of a semiconductor integrated circuit of a second embodiment.

FIG. 3 illustrates power supply wires in an M1 routing layer, an M2 routing layer above the M1 routing layer, an M3 routing layer above the M2 routing layer, an M4 routing layer above the M3 routing layer, an M5 routing layer above the M4 routing layer, and an M6 routing layer above the M5 routing layer.

FIG. 3 also illustrates first-layer via plugs V1 electrically connecting the power supply wires in the M1 and M2 routing layers, second-layer via plugs V2 electrically connecting the power supply wires in the M2 and M3 routing layers, third-layer via plugs V3 electrically connecting the power supply wires in the M3 and M4 routing layers, fourth-layer via plugs V4 electrically connecting the power supply wires in the M4 and M5 routing layers, and fifth-layer via plugs V5 electrically connecting the power supply wires in the M5 and M6 routing layers.

(2) Description of Structure in FIG. 4

FIG. 4 is a plan view illustrating the structure of the semiconductor integrated circuit of the second embodiment.

Subscripts in reference signs M1 to M6 and reference signs V1 to V5 are added to distinguish power supply wires and via plugs in the same layer. In FIG. 4, the M2 routing layer and the via plugs V1 and V2 are omitted for ease of illustration.

The M6 routing layer includes a first power supply strap wire $M6_A$ that is a VDD (first voltage) wire and a second power supply strap wire $M6_B$ that is a VSS (second voltage) wire. The wires $M6_A$ and $M6_B$ extend in the Y direction and are arranged so as to be adjacent to one another. A reference sign L denotes a central wire between the wires $M6_A$ and $M6_B$.

Although the M6 routing layer includes two power supply strap wires in FIG. 4, it may include three or more power supply strap wires. Each of the power supply strap wires may be a VDD wire and may be a VSS wire.

The M4 routing layer includes a first auxiliary power supply strap wire $M4_A$ that is a VDD wire and a second auxiliary power supply strap wire $M4_B$ that is a VSS wire. The wires $M4_A$ and $M4_B$ extend in the Y direction and are arranged so as to be adjacent to one another.

In the present embodiment, a width $W_2$ of the auxiliary power supply strap wires $M4_A$ and $M4_B$ is set to be smaller than a width $W_1$ of the power supply strap wires $M6_A$ and $M6_B$. Further, a distance $D_2$ between the auxiliary power supply strap wires $M4_A$ and $M4_B$ is set to be smaller than a distance $D_1$ between the power supply strap wires $M6_A$ and $M6_B$. In addition, the first and second auxiliary power supply strap wires $M4_A$ and $M4_B$ are arranged so as to be closer to the central line L than the first and second power supply strap wires $M6_A$ and $M6_B$.

Although the M4 routing layer includes two auxiliary power supply strap wires in FIG. 4, it may include three or more auxiliary power supply strap wires. Each of the auxiliary power supply strap wires may be a VDD wire and may be a VSS wire.

The M5 routing layer includes a first intermediate power supply wire $M5_A$ that is a VDD wire and a second intermediate power supply wire $M5_B$ that is a VSS wire. Each of the wires $M5_A$ and $M5_B$ electrically connects one of the power supply strap wires $M6_A$ and $M6_B$ to one of the auxiliary power supply strap wires $M4_A$ and $M4_B$. Specifically, the wire $M5_A$ electrically connects the first power supply strap wire $M6_A$ to the first auxiliary power supply strap wire $M4_A$. The wire $M5_B$ electrically connects the second power supply strap wire $M6_B$ to the second auxiliary power supply strap wire $M4_B$. The wires $M5_A$ and $M5_B$ extend in the X direction and are arranged on the same straight line.

The first intermediate power supply wire $M5_A$ includes a first region $R_1$ that overlaps with the first power supply strap wire $M6_A$, and a second region $R_2$ that does not overlap with the first power supply strap wire $M6_A$. Further, the second intermediate power supply wire $M5_B$ includes a third region $R_3$ that overlaps with the second power supply strap wire $M6_B$, and a fourth region $R_4$ that does not overlap with the second power supply strap wire $M6_B$. The second and fourth regions $R_2$ and $R_4$ are respectively located so as to be closer to the central line L than the first and third regions $R_1$ and $R_3$.

The M5 routing layer may include two or more first intermediate power supply wires that electrically connect the first power supply strap wire $M6_A$ to the first auxiliary power supply strap wire $M4_A$, and two or more second intermediate power supply wires that electrically connect the second power supply strap wire $M6_B$ to the second auxiliary power supply strap wire $M4_B$. A specific example of such a structure will be described later with reference to FIG. 5.

Hereinafter, the fifth-layer via plugs V5 are referred to as upper via plugs, and the fourth-layer via plugs V4 are referred to as lower via plugs.

The upper via plugs V5 includes one or more upper via plugs $V5_{A1}$ to $V5_{A3}$ that electrically connect the first power supply strap wire $M6_A$ to the first intermediate power supply wire $M5_A$, and one or more upper via plugs $V5_{B1}$ to $V5_{B3}$ that electrically connect the second power supply strap wire $M6_B$ to the second intermediate power supply wire $M5_B$. As illustrated in FIG. 4, the former upper via plugs $V5_{A1}$ to $V5_{A3}$ are arranged so as to overlap with the first region $R_1$, and the latter upper via plugs $V5_{B1}$ to $V5_{B3}$ are arranged so as to overlap with the third region $R_3$.

Further, the lower via plugs V4 includes one or more lower via plugs $V4_{A1}$ to $V4_{A6}$ that electrically connect the first auxiliary power supply strap wire $M4_A$ to the first intermediate power supply wire $M5_A$, and one or more lower via plugs $V4_{B1}$ to $V4_{B6}$ that electrically connect the second auxiliary power supply strap wire $M4_B$ to the second intermediate power supply wire $M5_B$. As illustrated in FIG. 4, the former lower via plugs $V4_{A1}$ to $V4_{A6}$ are arranged so as to overlap with the second region $R_2$, and the latter lower via plugs $V4_{B1}$ to $V4_{B6}$ are arranged so as to overlap with the fourth region $R_4$.

In the present embodiment, although all of the lower via plugs $V4_{A1}$ to $V4_{B6}$ overlap with the second or fourth region $R_2$ or $R_4$, only a part of the lower via plugs $V4_{A1}$ to $V4_{36}$ may overlap with the second or fourth region $R_2$ or $R_4$. For example, six of the twelve lower via plugs $V4_{A1}$ to $V4_{B6}$ may be located in the second or fourth region $R_2$ or $R_4$ in FIG. 4, and the other six may be located in the first or third region $R_1$ or $R_3$ in FIG. 4.

In the present embodiment, a thickness $H_5$ of the upper via plugs V5 is set to be larger than a thickness $H_4$ of the lower via plugs V4 (see FIG. 3). Further, a width $P_1$ of the upper via plugs V5 is set to be larger than a width $P_2$ of the lower via plugs V4. As a result, an area $P_1^2$ of the upper via plugs V5 is larger than an area $P_2^2$ of the lower via plugs V4. In addition, the lower via plugs V4 are arranged so as to be closer to the central line L than the upper via plugs V5.

In the present embodiment, a wire thickness $T_5$ of the M5 routing layer is set to be larger than a wire thickness $T_4$ of the M4 routing layer (see FIG. 3). As a result, the area of each upper via plug V5 is larger than the area of each lower via plugs V4.

Further, in the present embodiment, the X-directional width and the Y-directional width of the upper via plugs V5 may be different, and the X-directional width and the Y-directional width of the lower via plugs V4 may be different.

The intermediate power supply wires $M5_A$ and $M5_B$ have a function of replacing the upper via plugs V5 with the lower via plugs V4 that are closer to the central line L. That is, the intermediate power supply wires $M5_A$ and $M5_B$ function as a via position changing wires that change the positions of the via plugs for connecting the power supply strap wires $M6_A$ and $M6_B$ to the auxiliary power supply strap wires $M4_A$ and $M4_B$. Further, the intermediate power supply wires $M5_A$ and $M5_B$ have a function of replacing the upper via plugs V5 with the lower via plugs V4 having a different size (an area and a thickness).

The M1 to M3 routing layers will be described in detail.

The M1 routing layer includes a plurality of first power supply rails $M1_B$ and $M1_D$ that are VDD wires, and a plurality of second power supply rails $M1_A$ and $M1_C$ that are VSS wires. In FIG. 4, the plurality of first power supply rails $M1_B$ and $M1_D$ are electrically connected to one first auxiliary power supply strap wire $M4_A$, and the plurality of second power supply rails $M1_A$ and $M1_C$ are electrically connected to one second auxiliary power supply strap wire $M4_B$.

The first and second power supply rails $M1_A$ to $M1_D$ extend in the X direction and are arranged so as to be adjacent to one another. In the M1 routing layer, the first power supply rails $M1_B$ and $M1_D$ and the second power supply rails $M1_A$ and $M1_C$ are alternately arranged.

As illustrated in FIG. 4, both of the first and second intermediate power supply wires $M5_A$ and $M5_B$ are arranged so as not to overlap with the first power supply rails $M1_B$ and $M1_D$ and the second power supply rails $M1_A$ and $M1_C$. Specifically, in FIG. 4, the intermediate power supply wires $M5_A$ and $M5_B$ are arranged between the first power supply rail $M1_B$ and the second power supply rail $M1_C$ adjacent to each other.

Standard cells or gate array cells (not illustrated) are arranged between the first and second power supply rails $M1_A$ to $M1_D$. A VDD potential and a VSS potential are supplied to these cells from the first and second power supply rails $M1_A$ to $M1_D$. In the present embodiment, the wire structure illustrated in FIG. 4 is repetitively provided on a chip for each region in which these cells are arranged.

The M3 routing layer includes a plurality of first power supply wires $M3_B$ and $M3_D$ that are VDD wires, and a plurality of second power supply wires $M3_A$ and $M3_C$ that are VSS wires. The first power supply wires $M3_B$ and $M3_D$ electrically connect the first auxiliary power supply strap wire $M4_A$ to the first power supply rails $M1_B$ and $M1_D$, respectively. Further, the second power supply wires $M3_A$ and $M3_C$ electrically connect the second auxiliary power supply strap wire $M4_B$ to the second power supply rails $M1_A$ and $M1_C$, respectively. The first and second power supply wires $M3_A$ to $M3_D$ extend in the X direction and correspond to the first and second power supply rails $M1_A$ to $M1_D$ on a one-to-one basis.

As illustrated in FIG. 4, each of the first and second power supply wires $M3_A$ and M3 includes a region between the first and second auxiliary power supply strap wires $M4_A$ and $M4_B$. Specifically, in FIG. 4, the power supply wires $M3_A$ and $M3_C$ are arranged across the central line L.

As described above, the power supply wires $M3_A$ to $M3_D$ respectively correspond to the power supply rails $M1_A$ to $M1_D$ on a one-to-one basis. Accordingly, as illustrated in FIG. 4, the Y-directional pitch (interval) between the power supply wires $M3_A$ to $M3_D$ is coincident with the Y-directional pitch (interval) between the power supply rails $M1_A$ to $M1_D$.

Meanwhile, each of the intermediate power supply wires $M5_A$ and $M5_B$ corresponds to the plurality of power supply rails $M1_A$ to $M1_D$. Accordingly, in the present embodiment, the Y-directional pitch of the intermediate power supply wires $M5_A$ and $M5_B$ (the pitch between the first intermediate power supply wire $M5_A$ and another first intermediate power supply wire (not illustrated) and the pitch between the second intermediate power supply wire $M5_B$ and another second intermediate power supply wire (not illustrated)) can be set to be equal to or more than twice the Y-directional pitch between the power supply rails $M1_A$ to $M1_D$. A specific example of such a structure will be described later with reference to FIG. 5.

The above description of the power supply wires in the M3 routing layer similarly applies to the power supply wires in the M2 routing layer.

Regions in the M1 to M6 routing layers in which power supply wires and cells do not exist can be used for signal wires. In the present embodiment, the X direction is a preferred routing direction for the signal wires in the M1, M3, and M5 routing layers, and the Y direction is a preferred routing direction for the signal wires in the M2, M4, and M6 routing layers.

The semiconductor integrated circuit of the present embodiment may include M7 and higher routing layers. In this case, the semiconductor integrated circuit of the present embodiment may further include first and second upper power supply strap wires that extend in the X direction in the M7 routing layer. This can further enhance a power supplying function. A specific example of the first and second upper power supply strap wires will be described later with reference to FIG. 5 and FIG. 6.

In the present embodiment, the M6 and higher routing layers are thick enough to supply electric power to a large region on a chip. In FIG. 3, a thickness $T_6$ of the M6 routing layer is set to be larger than thicknesses $T_1$ to $T_5$ of the M1 to M5 routing layers. Because the M6 routing layer is thick, the sheet resistance of each of the first and second power supply strap wires $M6_A$ and $M6_B$ is low. Overall, the power supply wire width and the power supply wire interval of the M6 routing layer are set to be larger than the power supply wire width and the power supply wire interval of the M1 to M5 routing layers. Further, the smallest interval between the upper via plugs V5 is larger than the smallest interval between the lower via plugs V4.

Figure 5:
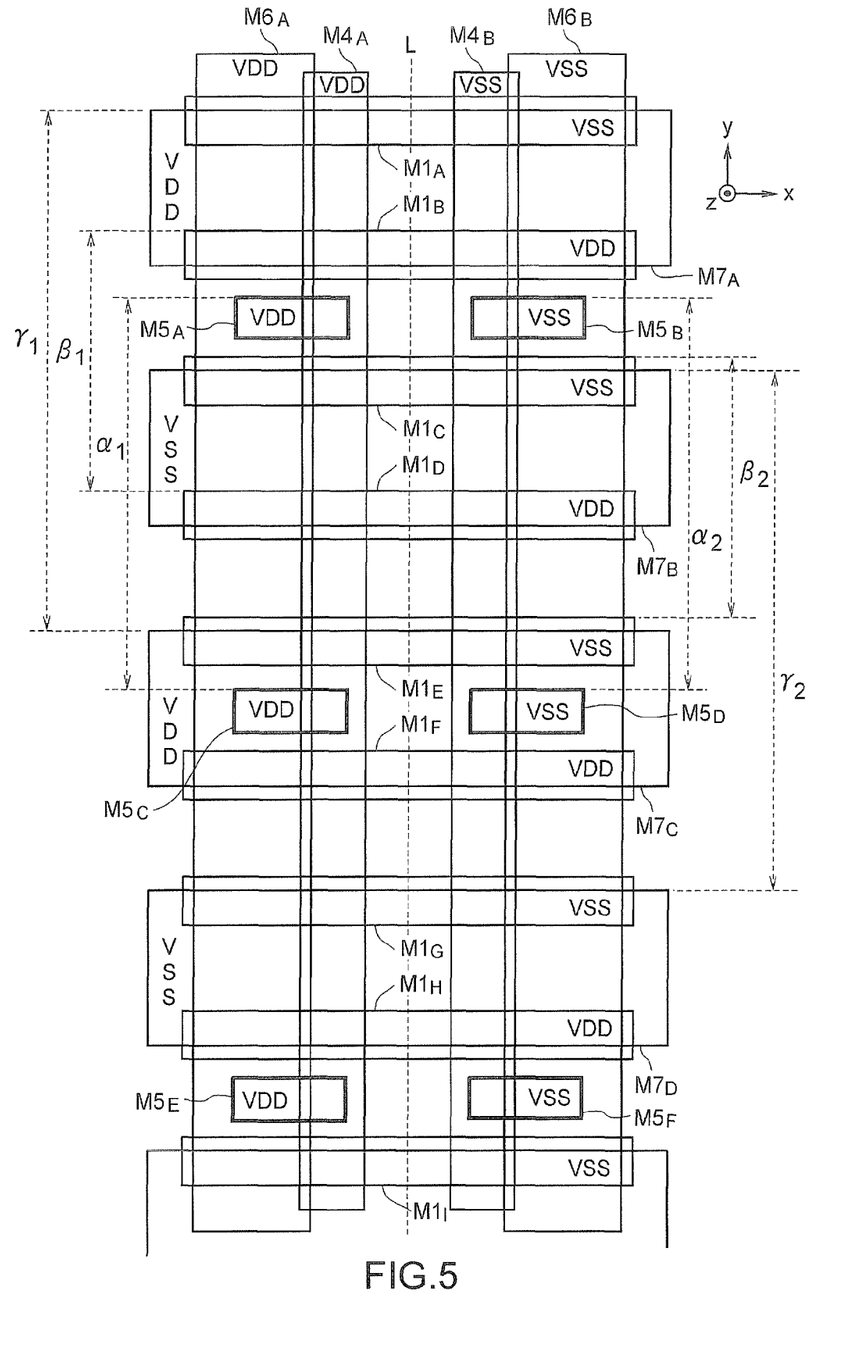
FIG. 5 is another plan view illustrating the structure of the semiconductor integrated circuit of the second embodiment.
Figure 6:
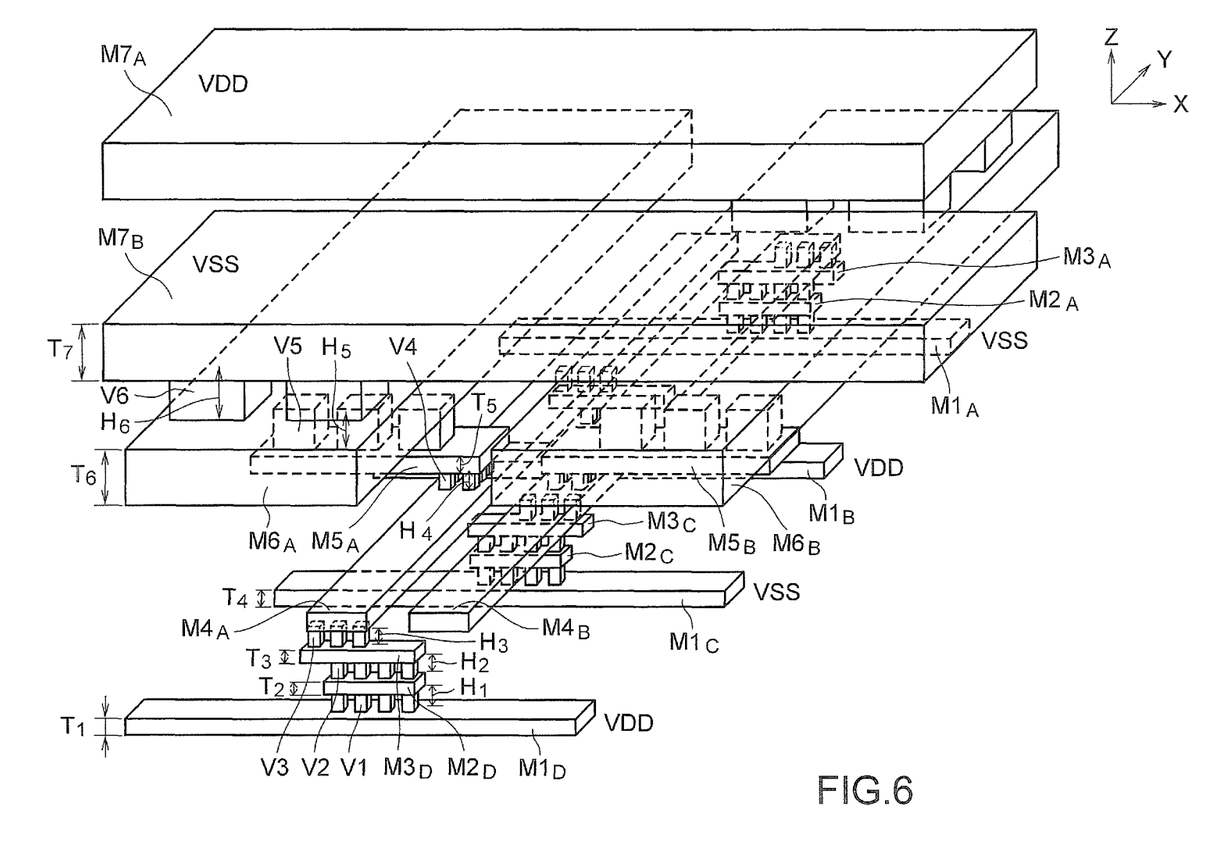
FIG. 6 is another perspective view illustrating the structure of the semiconductor integrated circuit of the second embodiment.

(3) Description of Structure in FIGS. 5 and 6

FIG. 5 is another plan view illustrating the structure of the semiconductor integrated circuit of the second embodiment. FIG. 5 illustrates a larger region than FIG. 3 and FIG. 4.

FIG. 6 is another perspective view illustrating the structure of the semiconductor integrated circuit of the second embodiment. FIG. 6 illustrates a part of the region of FIG. 5.

Hereinafter, the structure illustrated in FIG. 5 will be described. FIG. 6 serves to check a three-dimensional position relation of power supply wires illustrated in FIG. 5.

FIG. 5 illustrates power supply wires in the M7 routing layer above the M6 routing layer, in addition to the power supply wires in the M1, M4, M5, and M6 routing layers. In FIG. 5, the M2 and M3 routing layers and the via plugs V1 to V5 are omitted for ease of illustration. In FIG. 5, the sixth-layer via plugs V6 electrically connecting the power supply wires in the M6 and M7 routing layers are also omitted.

The M5 routing layer includes a plurality of first intermediate power supply wires $M5_A$, $M5_C$, and $M5_E$ that are VDD wires, and a plurality of second intermediate power supply wires $M5_B$, $M5_D$, and $M5_F$ that are VSS wires. The former wires $M5_A$, $M5_C$, and $M5_E$ electrically connect the first power supply strap wire $M6_A$ to the first auxiliary power supply strap wire $M4_A$, and the latter wires $M5_B$, $M5_D$, and $M5_F$ electrically connect the second power supply strap wire $M6_B$ to the second auxiliary power supply strap wire $M4_B$.

As illustrated in FIG. 5, the first intermediate power supply wires $M5_A$, $M5_C$, and $M5_E$ are arranged periodically along the Y direction. A reference sign $\alpha_1$ denotes the Y-directional interval between the first intermediate power supply wires $M5_A$, $M5_C$, and $M5_E$. Similarly, the second intermediate power supply wires $M5_B$, $M5_D$, and $M5_F$ are arranged periodically along the Y direction. A reference sign $\alpha_2$ denotes the Y-directional interval between the second intermediate power supply wires $M5_B$, $M5_D$, and $M5_F$. In the present embodiment, although $\alpha_1$ and $\alpha_2$ are set to the same value, they may be set to different values.

The M1 routing layer includes a plurality of first power supply rails $M1_B$, $M1_D$, $M1_F$, and $M1_H$ that are VDD wires, and a plurality of second power supply rails $M1_A$, M1, $M1_E$, $M1_G$, and $M1_I$ that are VSS wires. The former wires $M1_B$, $M1_D$, $M1_F$, and $M1_H$ are electrically connected to the first auxiliary power supply strap wire $M4_A$, and the latter wires $M1_A$, $M1_C$, $M1_E$, $M1_G$, and $M1_I$ are electrically connected to the second auxiliary power supply strap wire $M4_B$. The wires $M1_A$ to $M1_I$ extend in the X direction, and the first power supply rails and the second power supply rails are alternately arranged.

As illustrated in FIG. 5, the first power supply rails $M1_B$, $M1_D$, $M1_F$, and $M1_H$ are arranged periodically along the Y direction. A reference sign $\beta_1$ denotes the Y-directional interval between these first power supply rails. Similarly, the second power supply rails $M1_A$, $M1_C$, $M1_E$, $M1_G$, and $M1_I$ are arranged periodically along the Y direction. A reference sign $\beta_2$ denotes the Y-directional interval between these second power supply rails. In the present embodiment, although $\beta_1$ and $\beta_2$ are set to the same value, they may be set to different values.

The M7 routing layer includes a plurality of first upper power supply strap wires $M7_A$ and $M7_C$ that are VDD wires, and a plurality of second upper power supply strap wires $M7_B$ and $M7_D$ that are VSS wires. The former wires $M7_A$ and $M7_C$ are electrically connected to the first power supply strap wire $M6_A$, and the latter wires $M7_B$ and $M7_D$ are electrically connected to the second power supply strap wire $M6_B$. The wires $M7_A$ to $M7_D$ extend in the X direction, and the first upper power supply strap wires and the second upper power supply strap wires are alternately arranged.

As illustrated in FIG. 5, the first upper power supply strap wires $M7_A$ and $M7_C$ are arranged periodically along the Y direction. A reference sign $\gamma_1$ denotes the Y-directional interval between these first upper power supply strap wires. Similarly, the second upper power supply strap wires $M7_B$ and $M7_D$ are arranged periodically along the Y direction. A reference sign $\gamma_2$ denotes the Y-directional interval between these second upper power supply strap wires. In the present embodiment, although $\gamma_1$ and $\gamma_2$ are set to the same value, they may be set to different values.

In the present embodiment, the interval $\alpha_1$ between the first intermediate power supply wires $M5_A$, $M5_C$, and $M5_E$ is set to be larger than the interval $\beta_1$ between the first power supply rails $M1_B$, $M1_D$, $M1_F$, and $M1_H$, and is set to be smaller than the interval $\gamma_1$ between the first upper power supply strap wires $M7_A$ and $M7_C$ ($\beta_1 < \alpha_1 < \gamma_1$).

Further, in the present embodiment, the interval $\alpha_2$ between the second intermediate power supply wires $M5_B$, $M5_D$, and $M5_F$ is set to be larger than the interval $\beta_2$ between the second power supply rails $M1_A$, $M1_C$, $M1_E$, $M1_G$, and $M1_I$, and is set to be smaller than the interval $\gamma_2$ between the second upper power supply strap wires $M7_B$ and $M7_D$ ($\beta_2 < \alpha_2 < \gamma_2$).

Although the intermediate power supply wires, the power supply rails, and the upper power supply strap wires are arranged periodically in the present embodiment, the semiconductor integrated circuit of the present embodiment may include both a periodic region in which these wires are arranged periodically and a non-periodic region in which these wires are arranged non-periodically. In this case, the relations of $\beta_1 < \alpha_1 < \gamma_1$ and $\beta_2 < \alpha_2 < \gamma_2$ can be set within the periodic region.

(4) Advantages of Semiconductor Integrated Circuit of Second Embodiment

Advantages of the semiconductor integrated circuit of the second embodiment will be described in detail with reference to FIG. 3 to FIG. 6.

In the present embodiment, the wire width $W_1$ and the wire distance $D_1$ of the power supply strap wires $M6_A$ and $M6_B$ are set to be large. The reason for this is that, because the thickness $T_6$ of the M6 routing layer is large, the wires $M6_A$ and $M6_B$ have no choice but to be roughly processed due to design rules.

Meanwhile, in the present embodiment, the wire width $W_2$ and the wire distance $D_2$ of the auxiliary power supply strap wires $M4_A$ and $M4_B$ are set to be smaller than the wire width $W_1$ and the wire distance $D_1$, respectively. The reason for this is that, because the thickness $T_4$ of the M4 routing layer is smaller than the thickness $T_6$, the wires $M4_A$ and $M4_B$ can be more finely processed.

Figure 7A:
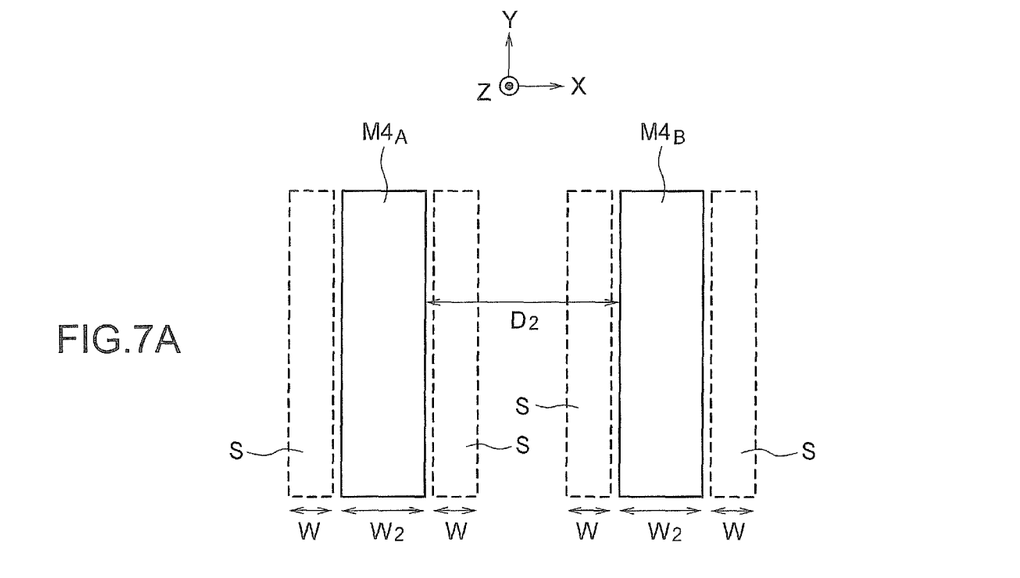
FIGS. 7A and 7B are plan views for explaining a method of arranging M4 power supply wires of the second embodiment.
Figure 7B:
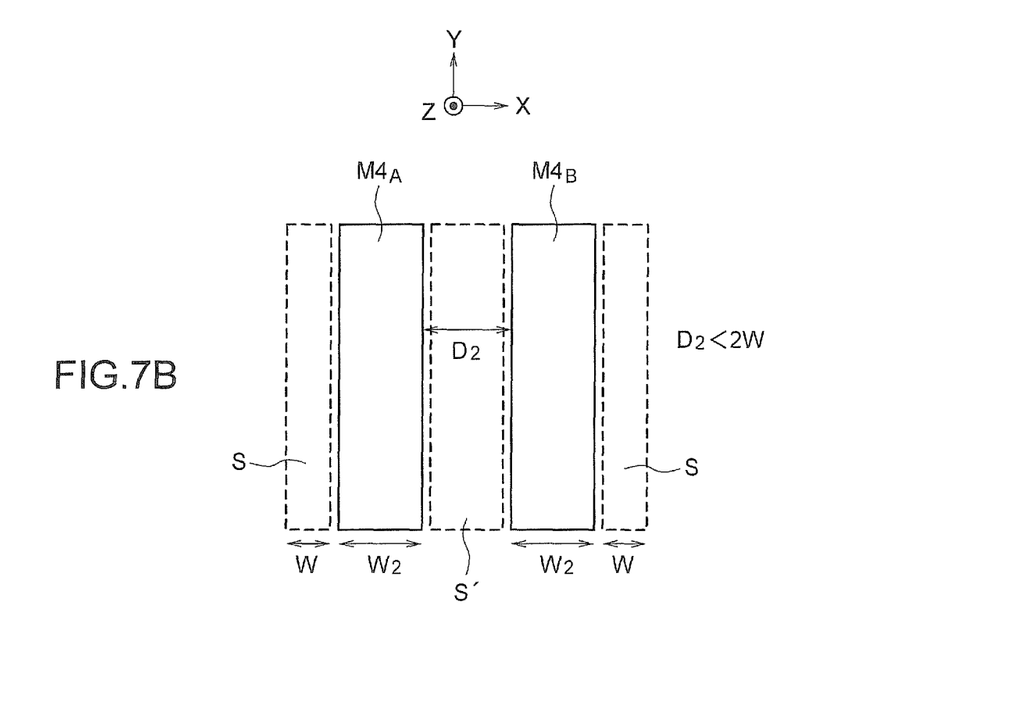

Hereinafter, advantages obtained by setting the wire width $W_2$ and the wire distance $D_2$ to be small will be described with reference to FIGS. 7A and 7B. FIGS. 7A and 7B are plan views for explaining a method of arranging the M4 power supply wires of the second embodiment.

FIG. 7A illustrates the first and second auxiliary power supply strap wires $M4_A$ and $M4_B$ whose wire distance $D_2$ is set to be large. Reference signs S denote regions in which signal wires cannot be arranged because the regions is excessively close to the auxiliary power supply strap wire $M4_A$ or $M4_B$. Further, reference signs W denote the X-directional width of the regions S. In the case of FIG. 7A, signal wires cannot be arranged inside of the auxiliary power supply strap wires $M4_A$ and $M4_B$ and inside of the four regions S.

FIG. 7B illustrates the first and second auxiliary power supply strap wires $M4_A$ and $M4_B$ whose wire distance $D_2$ is set to be small. In FIG. 7B, the wire distance $D_2$ is set to be smaller than twice the width W. In FIG. 7B, two regions S between the auxiliary power supply strap wires $M4_A$ and $M4_B$ are connected to become a region S' having an area smaller than the total area of the two regions S (S'<2×S).

As a result, regions in which signal wires cannot be arranged are 4×S in FIG. 7A, whereas regions in which signal wires cannot be arranged are 2×S+S' in FIG. 7B which is smaller than 4×S. Accordingly, in the case of FIG. 7B, the area for signal wire arrangement is larger compared with the case of FIG. 7A. The area for signal wire arrangement can also be made larger by making the wire width $W_2$ of the auxiliary power supply strap wires $M4_A$ and $M4_B$ be smaller.

As described above, according to the present embodiment, the wire width $W_2$ and the wire distance $D_2$ of the auxiliary power supply strap wires $M4_A$ and $M4_B$ are made smaller, whereby the area for signal wire arrangement can be made larger.

In the present embodiment, the wire width $W_2$ and the wire distance $D_2$ are smaller than the wire width $W_1$ and the wire distance $D_1$, respectively, and therefore the power supply strap wires $M6_A$ and $M6_B$ and the auxiliary power supply strap wires $M4_A$ and $M4_B$ are offset with respect to each other as illustrated in FIG. 4.

Accordingly, the first intermediate power supply wire $M5_A$ of the present embodiment includes the first region $R_1$ that overlaps with the first power supply strap wire $M6_A$, and the second region $R_2$ that does not overlap with the first power supply strap wire $M6_A$, in order to connect the wire $M6_A$ and the wire $M4_A$ that are offset with respect to each other (see FIG. 4). With this configuration, the wire $M6_A$ and the wire $M5_A$ can be connected using the first region $R_1$, and the wire $M4_A$ and the wire $M5_A$ can be connected using the second region $R_2$.

Similarly, the second intermediate power supply wire $M5_B$ of the present embodiment includes the third region $R_3$ that overlaps with the second power supply strap wire $M6_B$, and the fourth region $R_4$ that does not overlap with the second power supply strap wire $M6_B$, in order to connect the wire $M6_B$ and the wire $M4_B$ (see FIG. 4). With this configuration, the wire $M6_B$ and the wire $M5_B$ can be connected using the third region $R_3$, and the wire $M4_B$ and the wire $M5_B$ can be connected using the fourth region $R_4$.

In the present embodiment, in order to connect the power supply strap wires $M6_A$ and $M6_B$ and the intermediate power supply wires $M5_A$ and $M5_B$ configured as described above, the upper via plugs V5 are arranged so as to overlap with the first or third region $R_1$ or $R_3$.

In the present embodiment, in order to connect the auxiliary power supply strap wires $M4_A$ and $M4_B$ and the intermediate power supply wires $M5_A$ and $M5_B$ configured as described above, at least a part the lower via plugs V4 are arranged so as to overlap with the second or fourth region $R_2$ or $R_4$.

In the present embodiment, the intermediate power supply wires $M5_A$ and $M5_B$ in FIG. 4 extend in the X direction and are arranged on the same straight line. Such a configuration is advantageous in that a larger region for signal wire arrangement can be secured in the M5 routing layer compared with, for example, the case where the wires $M5_A$ and $M5_B$ extend in the Y direction and the case where the wires $M5_A$ and $M5_B$ are arranged on different straight lines. Further, in the present embodiment, the intermediate power supply wires $M5_C$ and $M5_D$ in FIG. 5 are arranged on the same straight line, and the intermediate power supply wires $M5_E$ and $M5_F$ in FIG. 5 are arranged on the same straight line.

In the present embodiment, as illustrated in FIG. 5, the interval $\alpha_1$ between the first intermediate power supply wires is set to be larger than the interval $\beta_1$ between the first power supply rails, and the interval $\alpha_2$ between the second intermediate power supply wires is set to be larger than the interval $\beta_2$ between the second power supply rails. As a result, according to the present embodiment, the intervals $\alpha_1$ and $\alpha_2$ are set to be large and the number of the intermediate power supply wires $M5_A$ to $M5_F$ is reduced, whereby a larger region for signal wire arrangement can be secured in the M5 routing layer.

In the present embodiment, as illustrated in FIG. 5, the interval $\alpha_1$ between the first intermediate power supply wires is set to be smaller than the interval $\gamma_1$ between the first upper power supply strap wires, and the interval $\alpha_2$ between the second intermediate power supply wires is set to be smaller than the interval $\gamma_2$ between the second upper power supply strap wires. As a result, according to the present embodiment, the intervals $\alpha_1$ and $\alpha_2$ are set to be smaller than the intervals $\gamma_1$ and $\gamma_2$, and the number of the intermediate power supply wires $M5_A$ to $M5_F$ are made larger than the number of the upper power supply strap wires $M7_A$ to $M7_D$, whereby a problem that an insufficient number of the intermediate power supply wires $M5_A$ to $M5_F$ causes an excessive drop of the power supply voltage can be suppressed.

According to the present embodiment, the configuration described above can reduce regions used for power supply wires, and can increase routing tracks usable for signal wires. As a result, according to the present embodiment, signal wire congestion can be alleviated, and signal wire efficiency can be improved. This can be expected to suppress, for example, an increase in costs due to an increase in chip area, an increase in signal wire length for detouring around power supply wires, a decrease in accuracy of timing control, an increase in cell area, and an increase in consumed power.

In the present embodiment, the power supply strap wires $M6_A$ and $M6_B$ and the auxiliary power supply strap wires $M4_A$ and $M4_B$ may be arranged so as not to be offset with respect to each other. In this case, according to the present embodiment, the adoption of a structure that satisfies the relations of $\beta_1 < \alpha_1 < \gamma_1$ and $\beta_2 < \alpha_2 < \gamma_2$ described above can lead to, for example, an increase in routing tracks usable for signal wires while suppressing the drop of the power supply voltage.

While certain embodiments have been described, these embodiments have been presented by way of example only, and are not intended to limit the scope of the inventions. Indeed, the novel circuits described herein may be embodied in a variety of other forms; furthermore, various omissions, substitutions and changes in the form of the circuits described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:
   one or more power supply strap wires arranged in a first routing layer and extending in a first direction;
   one or more auxiliary power supply strap wires arranged in a second routing layer below the first routing layer and extending in the first direction;
   intermediate power supply wires arranged in a third routing layer between the first and second routing layers, each of the intermediate power supply wires electrically connecting one of the power supply strap wires to one of the auxiliary power supply strap wires through at least a via plug arranged between the first and third routing layers and at least a via plug arranged between the second and third routing layers;
   power supply rails arranged in a fourth routing layer below the second routing layer, extending in a second direction perpendicular to the first direction, and electrically connected to the auxiliary power supply strap wires; and
   upper power supply strap wires arranged in a fifth routing layer above the first routing layer, extending in the second direction, and electrically connected to the power supply strap wires,
   wherein an interval in the first direction between the intermediate power supply wires is larger than an interval in the first direction between the power supply rails, and is smaller than an interval in the first direction between the upper power supply strap wires.

2. The circuit of claim 1, further comprising:
   first via plugs electrically connecting the power supply strap wires to the intermediate power supply wires; and
   second via plugs electrically connecting the auxiliary power supply strap wires to the intermediate power supply wires,
   wherein at least one of an area and a thickness of the second via plugs is different from an area and a thickness of the first via plugs.

3. The circuit of claim 1, wherein a width of the auxiliary power supply strap wires is smaller than a width of the power supply strap wires.

4. The circuit of claim 1, wherein the intermediate power supply wires extend in the second direction.

5. The circuit of claim 1, wherein
   the power supply strap wires include first and second power supply strap wires,
   the auxiliary power supply strap wires include first and second auxiliary power supply strap wires, and
   the intermediate power supply wires include first intermediate power supply wires electrically connecting the first power supply strap wire to the first auxiliary power supply strap wire, and second intermediate power supply wires electrically connecting the second power supply strap wire to the second auxiliary power supply strap wire.

6. The circuit of claim 5, wherein a distance between the first and second auxiliary power supply strap wires is smaller than a distance between the first and second power supply strap wires.

7. The circuit of claim 5, wherein the first and second auxiliary power supply strap wires are respectively arranged so as to be closer to a central line between the first and second power supply strap wires than the first and second power supply strap wires.

8. The circuit of claim 5, wherein the first and second intermediate power supply wires are arranged on the same straight lines.

9. The circuit of claim 5, further comprising:
   first via plugs electrically connecting the power supply strap wires to the intermediate power supply wires; and
   second via plugs electrically connecting the auxiliary power supply strap wires to the intermediate power supply wires,
   wherein the second via plugs are arranged so as to be closer to a central line between the first and second power supply strap wires than the first via plugs.

10. The circuit of claim 5, wherein
    each of the first intermediate power supply wires includes a first region which overlaps with the first power supply strap wire, and a second region which does not overlap with the first power supply strap wire, and
    each of the second intermediate power supply wires includes a third region which overlaps with the second power supply strap wire, and a fourth region which does not overlap with the second power supply strap wire.

11. The circuit of claim 10, wherein the second and fourth regions are respectively arranged so as to be closer to a central line between the first and second power supply strap wires than the first and third regions.

12. The circuit of claim 10, wherein areas of the second and fourth regions are respectively smaller than areas of the first and third regions.

13. The circuit of claim 10, further comprising:
    first via plugs electrically connecting the power supply strap wires to the intermediate power supply wires; and
    second via plugs electrically connecting the auxiliary power supply strap wires to the intermediate power supply wires,
    wherein
    the first via plugs are arranged so as to overlap with one of the first and third regions, and
    at least a part of the second via plugs are arranged so as to overlap with one of the second and fourth regions.

14. The circuit of claim 5, wherein the power supply rails include first power supply rails electrically connected to the first auxiliary power supply strap wire, and second power supply rails electrically connected to the second auxiliary power supply strap wire.

15. The circuit of claim 14, wherein the first and second power supply rails are alternately arranged in the fourth routing layer.

16. The circuit of claim 14, wherein both of the first and second intermediate power supply wires are arranged so as not to overlap with the first and second power supply rails.

17. The circuit of claim 14, further comprising at least one sixth routing layer between the second and fourth routing layers,
   wherein the sixth routing layer includes first power supply wires electrically connecting the first auxiliary power supply strap wire to the first power supply rails, and second power supply wires electrically connecting the second auxiliary power supply strap wire to the second power supply rails.

18. The circuit of claim 17, wherein the first and second power supply wires extend in the second direction.

19. The circuit of claim 17, wherein each of the first and second power supply wires include a region located between the first and second auxiliary power supply strap wires.

20. The circuit of claim 5, wherein the upper power supply strap wires include first upper power supply strap wires electrically connected to the first power supply strap wire, and second upper power supply strap wires electrically connected to the second power supply strap wire.

21. The circuit of claim 1, wherein
   the one or more power supply strap wires include a first power supply strap wire,
   the one or more auxiliary power supply strap wires include a first auxiliary power supply strap wire,
   the intermediate power supply wires include first intermediate power supply wires that electrically connect the first power supply strap wire to the first auxiliary power supply strap wire and are periodically arranged to have a first interval in the first direction between the first intermediate power supply wires,
   the power supply rails include first power supply rails that are electrically connected to the first auxiliary power supply strap wire and are periodically arranged to have a second interval in the first direction between the first power supply rails,
   the upper power supply strap wires include first upper power supply strap wires that are electrically connected to the first power supply strap wire and are periodically arranged to have a third interval in the first direction between the first upper power supply strap wires, and
   the first interval is larger than the second interval and is smaller than the third interval.

* * * * *